Nov. 24, 1964 E. K. HOWELL 3,158,781

GAS DIODE COUNTER CIRCUIT

Filed May 24, 1961 2 Sheets-Sheet 1

INVENTOR.
EDWARD K. HOWELL
BY
William C. Cahill

Nov. 24, 1964 E. K. HOWELL 3,158,781

GAS DIODE COUNTER CIRCUIT

Filed May 24, 1961 2 Sheets-Sheet 2

INVENTOR.
EDWARD K. HOWELL
BY
William C. Cahill

United States Patent Office 3,158,781

Patented Nov. 24, 1964

3,158,781
GAS DIODE COUNTER CIRCUIT

Edward K. Howell, Hendersonville, N.C., assignor to General Electric Company, a corporation of New York Filed May 24, 1961, Ser. No. 112,445
7 Claims. (Cl. 315—84.5)

This invention pertains to counter circuits, and more particularly, to counter circuits utilizing gas diode elements.

Counter circuits generally include a plurality of stages connected in parallel across a common source of potential. The individual stages may be bistable and thus exhibit two stable states of operation. In one type of counter circuit, each stage is capable of maintaining either of two values of conductivity. Thus, current will flow more readily through those stages having a high conductivity than those having a low conductivity. The stages are arranged so that only one stage may be in the high conductivity state at a time. The individual stages usually include a means for inhibiting high conductivity unless a preconditioning signal is supplied to the respective stage from a preceding stage. This "preconditioning" allows the stage to become receptive to a pulse which is applied to all stages simultaneously. The receptivity of the particular stage enables that stage to conduct when the pulse is received, and cut off the current to the preceding stage. Accordingly, as each stage conducts, the next succeeding stage is preconditioned to permit a change in current path for the current from the potential source each time a suitable pulse, referred to as a triggering pulse, is received by the counter. The final stage of the counter circuit may be connected to the first stage of the circuit to provide a means for initiating conduction in the first stage after the final stage has been triggered off.

The use of gas filled cold cathode diodes in counter circuits of the type described provides a generally rugged and reliable circuit yielding an optical, as well as electrical, indication of the state of conduction of each stage. However, prior art gas diode counter circuits require the utilization of rectifiers, usually germanium diodes, to provide unidirectional triggering. Rectifiers, such as are required in prior art gas diode counters, add to the expense of the counter without significantly contributing to the reliability, or longevity of the circuit.

Accordingly, it is a primary object of the present invention to provide an improved gas diode counter circuit.

It is a further object of the present invention to provide a less expensive gas diode counter circuit.

It is still another object of the present invention to provide a counter circuit utilizing exclusively cold cathode gas filled diodes.

Further objects and advantages of the present invention will become apparent to those skilled in the art as the description thereof proceeds.

Briefly stated, in accordance with one embodiment of the present invention, a gas diode counter circuit is provided having a plurality of stages each comprising two series-connected gas diodes joined to a source of potential through a series resistor. Each stage is connected to the succeeding stage through a capacitor-resistance arrangement whereby the conduction of a given stage prepares the succeeding stage for conduction upon receipt of a triggering pulse. The only active elements in the present gas diode counter circuit are cold cathode gas filled diodes therefore eliminating the necessity of expensive rectifiers and increasing the longevity and reliability of the circuit. Since each stage includes two gas diodes, increased light output is available from each conducting stage. The utilization of the series-connected gas diodes provides excellent stability and reliability of operation while affording a substantial cost saving over the gas diode counter circuits of the prior art.

The invention, both as to its organization and operation together with further objects and advantages thereof, may best be understood by reference to the following description taken in connection with the accompanying drawings in which.

Figure 1:
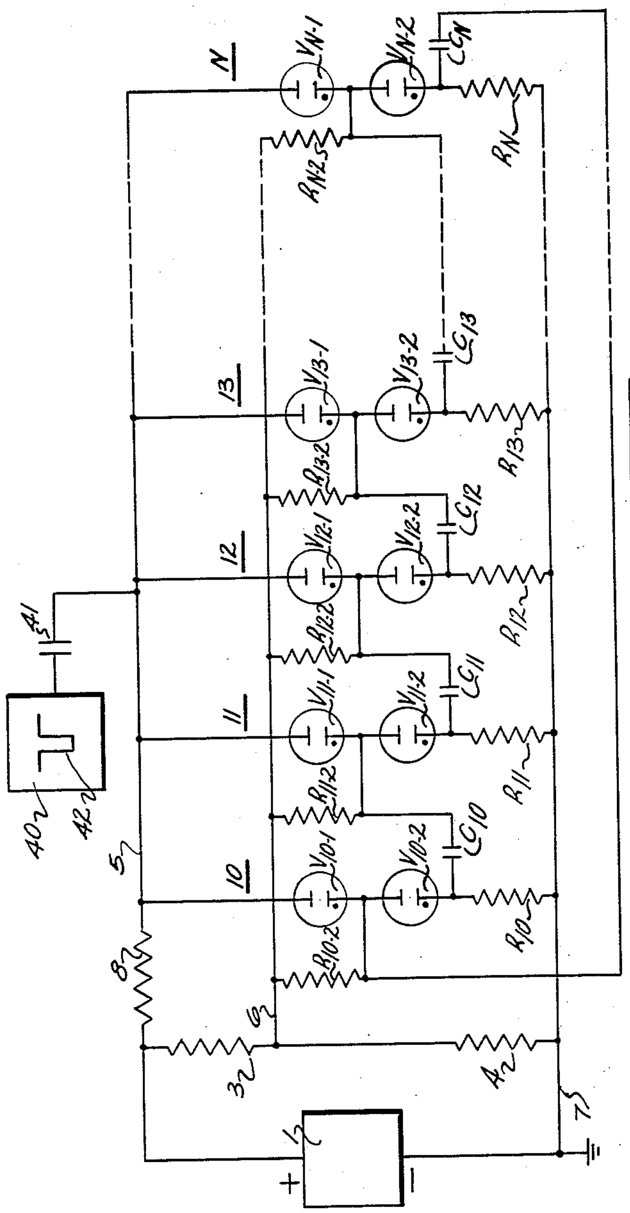
FIG. 1 shows a gas diode counter circuit constructed in accordance with the teachings of the present invention.

Referring to FIG. 1, a gas diode counter circuit is shown constructed in accordance with the teachings of the present invention. The counter circuit is provided with a suitable source of potential 1. A voltage divider circuit comprising resistors 3 and 4 is provided for supplying the counter with suitable potentials through conductors 5, 6, and 7. A current limiting resistor 8 is included in series with the potential source 1. The successive stages of the counter circuit are indicated generally at 10, 11, 12, 13 and N. The counter may comprise any number of stages, and accordingly the final stage, or Nth stage, is indicated in FIG. 1 at N. Each stage of the counter is provided with a pair of series-connected gas diodes joined to one side of the potential source 1 by conductor 5 and to the opposite side of potential source 1 by conductor 7 through series resistors $R_{10}$, $R_{11}$, $R_{12}$, $R_{13}$, and $R_N$, respectively. The diodes of stage 10 are designated $V_{10-1}$ and $V_{10-2}$, and the diodes of stage 11 are designated $V_{11-1}$ and $V_{11-2}$. The remaining diodes may be designated by the appropriate subscripts corresponding to the respective stages. The junction of diode $V_{10-2}$ and resistor $R_{10}$ is joined to the junction of the tube $V_{11-1}$ and $V_{11-2}$ through the capacitor $C_{10}$. Similarly, stage 11 is connected to stage 12 through capacitor $C_{11}$. Accordingly, each stage is connected to each succeeding stage through a capacitor joined from the junction of the gas diode and resistor of the respective stage to the junction between the two gas diodes of the succeeding stage.

The junction between the two gas diodes in each stage of the counter circuit is also joined to the conductor 6 through resistors $R_{10-2}$–$R_{N-2}$, respectively. The final stage N of the counter circuit is connected to the first stage 10 through capacitor $C_N$ to thereby "complete" the counter circuit and yield a counter circuit which will provide for the conduction of successive stages. An input trigger source 40 is coupled to the conductor 5 through a coupling capacitor 41. The triggering pulse, indicated generally at 42, is fed through the conductor 5 to all of the counter stages simultaneously.

Each of the diodes may be any one of a variety of types of cold cathode gas diodes; however, the characteristics of the first diode in each stage, $V_{10-1}$–$V_{N-1}$, should be similar; correspondingly, the second diode in each stage, $V_{10-2}$–$V_{N-2}$, should be similar. Cold cathode gas diodes generally exhibit two stable states: conducting and nonconducting. To render the diode conductive, a certain minimum potential is necessary; however, to maintain conduction once it has begun requires a lower potential. Thus, a diode may be considered an open-circuit until the required potential is applied at which time the gas within the diode ionizes and the tube conducts. Thereafter, the potential is reduced and conduction continues until the applied potential is further reduced to a value below that required to maintain ionization of the gas; the diode then returns to its open-circuit state.

The operation of the circuit shown in FIG. 1 may be described as follows. The potential source 1 and voltage divider 3 and 4 provide two levels of potential to the counter circuit. The potential existing on conductor 5 is sufficient to cause conduction of one of the diodes of a stage, but is not sufficient to cause conduction of both diodes connected in series. The potential of conductor 6 is lower than that of conductor 5 and is insufficient to either cause or maintain conduction in any of the diodes. Assuming that the first stage 10 is conducting, current flows from conductor 5 through gas diodes $V_{10-1}$ and $V_{10-2}$, through resistor $R_{10}$ to conductor 7. When a trigger pulse 42 is supplied to the circuit, the potential of conductor 5 is reduced to a value below that necessary to support conduction in any of the stages; therefore, the first stage is cut off. The voltage appearing across the resistor $R_{10}$ immediately drops when the tubes $V_{10-1}$ and $V_{10-2}$ stop conducting. This negative-going voltage at the junction of $V_{10-2}$ and $R_{10}$ is transmitted to the succeeding stage through coupling capacitor $C_{10}$. The voltage at the junction of $V_{11-1}$ and $V_{11-2}$ of the second stage 11 is thus reduced, and immediately after the trigger pulse is removed from the conductor 5, the voltage existing across the gas diode $V_{11-1}$ is sufficient to cause ionization. The ionization of the latter gas diode reduces the potential drop across the diode thereby raising the potential of the junction between the two diodes of the second stage and consequently causing ionization of tube $V_{11-2}$. The second stage 11 is thus switched "on" and remains conducting until another trigger pulse is received at which time the succeeding stage is rendered conducting in a similar manner and stage 11 is switched "off." Resistors $R_{10-2}$–$R_{N-2}$ are connected to the intermediate potential conductor 6 thereby maintaining the potential of the junction between gas diodes in each stage at a potential sufficiently high to prevent conduction of the first tube in each stage. Therefore, the respective stages are prevented from conducting until a negative-going voltage is transmitted through the preceding stage's coupling capacitor.

Figure 2:
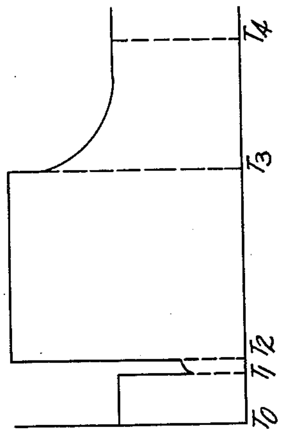
FIG. 2 shows a voltage wave form to facilitate the description of the operation of the circuit of FIG. 1.

FIG. 2 represents the relative voltages present at the junction between the two gas diodes of any channel. Referring to FIG. 2, the portion of the waveform represented by the distance $T_0$–$T_1$ is the voltage level of the respective junction when the particular counter stage is not conducting. When a pulse is received, assuming that the preceding stage is already conducting, the preceding stage ceases conducting, and the voltage-change occurring at that stage's series resistance is coupled to the succeeding stage through the coupling capacitor. The resulting reduction in the voltage at the junction under discussion is shown by FIG. 2 at the time $T_1$. Immediately after the completion of the trigger pulse, that is, at time $T_2$, the particular stage under consideration begins to conduct, and the voltage at the junction rises immediately to a value determined by the operating voltage of the diode, that is, the voltage between the junction and the potential source during the conduction of the respective diode. The time represented by the distance $T_2$–$T_3$ is determined by the time between trigger pulses, and at time $T_3$, when a trigger pulse is received, the stage ceases to conduct. However, the voltage at the junction does not immediately return to its quiescent value; this fact is exemplified by the voltage decay evidenced by the curve of FIG. 2 between the times $T_3$ and $T_4$. During this time, the voltage at the junction is decaying in accordance with the RC time constant of the coupling capacitor of the preceding stage and the resistance connected between the junction of the two diodes and the conductor 6 of FIG. 1.

The following table represents typical values of capacitance, resistance, voltages, and tube types that may be utilized in constructing the circuit of FIG. 1:

| | |
|---|---|
| Potential source **1** | 165 v. |
| Voltage on conductor **5** | 155 v. |
| Voltage on conductor **6** | 35 v. |
| Voltage on conductor **7** | Ground. |
| Resistance **3** | 120K. |
| Resistance **4** | 33K. |
| Resistance **8** | 22K. |
| Resistance $R_{N-2}$ | 2.2 meg. |
| Resistance $R_N$ | 43K. |
| Capacitor $C_N$ | 5$\mu$f. |
| Gas diode $V_{N-1}$ | GE type NE–96. |
| Gas diode $V_{N-2}$ | GE type NE–2. |

Figure 3:
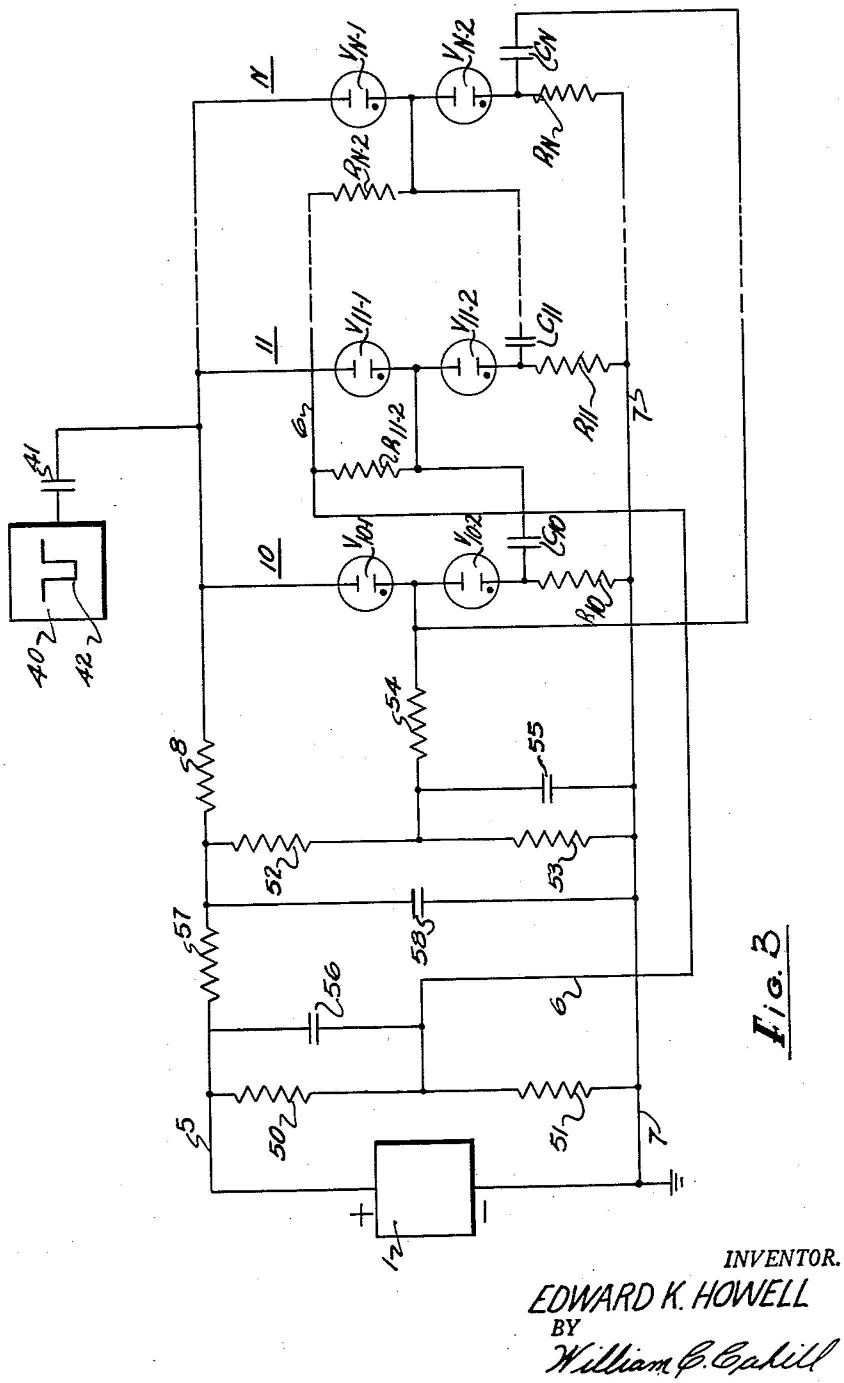
FIG. 3 shows a modification of the circuit of FIG. 1.

FIG. 3 shows a modification of the circuit of FIG. 1. The circuit of FIG. 3 is similar to that of FIG. 1 except that provision is made for insuring that only the first stage of the counter will conduct when the counter is first turned on. Referring to FIG. 3, it may be seen that stages 10, 11, and 12, are identical to the corresponding stages of FIG. 1 and corresponding elements of the figure are numbered alike. A voltage divider comprising resistors 50 and 51 is provided between the input conductors 5 and 7 for supplying an intermediate voltage through conductor 6 to all of the stages of the counter with the exception of the first stage. The first stage is provided with a second voltage divider comprising resistors 52 and 53. The junction between the resistors 52 and 53 is joined to the junction between the gas diodes of the first stage through a resistance 54. The second resistance 53 of the voltage divider for the first stage is provided with a shunting capacitance 55; a similar shunting capacitance 56 is provided for resistance 50 of the first voltage divider. A third capacitance 58 joins conductor 5 on the low voltage side of resistor 57 to conductor 7.

The operation of the circuit of FIG. 3 is identical to that of FIG. 1 except for the brief time during which the circuit is first turned on. It is assumed that the voltage is applied suddenly, and that only the first stage 10 is to conduct immediately after the circuit is switched on. Resistor 57 and capacitor 58 form an RC circuit having a time constant of approximately one-half of the time constant of the RC circuit between each of the stages. That is, RC circuit 57–58 has one-half the time constant of RC circuit $R_{11-2}C_{10}$. Resistors 52 and 53 and capacitor 55 form a second RC circuit having a time constant greater than the RC time constant of the capacitor and resistor between each stage. Consequently, when the voltage is first applied to conductor 5, its rate of rise is limited by the RC circuit 57, 58; however, the RC circuit 52, 53, and 55, delays the application of the intermediate voltage to the junction between the two gas diodes of the first stage. Therefore, the voltage applied across tube $V_{10-1}$ will momentarily be large enough to cause ionization. The first stage 10 will then switch "on" and the circuit will be ready to receive a trigger pulse.

The remaining stages of the counter circuit are prevented from being switched "on" by the application of the intermediate voltage on conductor 6 to the junction of the diodes in each stage. This intermediate voltage is applied before the voltage on conductor 5 rises to its full value. The delay in the rise of the voltage on conductor 5 is caused by the RC circuit 57–58; however, a third RC circuit, resistors 50 and 51 and capacitor 56, having a time constant equal to the RC circuit of the resistance and capacitance between each stage, applies the intermediate voltage to the conductor 6 before the voltage on conductor 5 reaches its full value. Therefore, the first tube in each of the stages, with the exception of stage 10, is prevented from ionizing, and only stage 10 is permitted to be switched "on."

While the principles of the invention have now been made clear in illustrative embodiments, there will be immediately obvious to those skilled in the art many modifications in structure, arrangement, proportions, the elements, materials, and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What is claimed as new and desired to secure by Letters Patent of the United States is:

1. A counter circuit for counting pulses applied thereto comprising, a plurality of stages each having a first and a second gas diode electrically connected in series to form a series circuit, means for simultaneously applying pulses to said series circuits, a source of electric potential, means electrically connecting each of said series circuits to said source of electric potential in parallel with each of the other of said series circuits, and means for preconditioning one of said series circuits for causing conduction therein after a pulse is received by said series circuits, said conditioning means comprising a capacitor connected between the junction of the first and second diodes of the series circuit to be preconditioned and a different one of said series circuits.

2. A counter circuit for counting pulses applied thereto comprising, a plurality of stages each having a first and a second gas diode electrically connected in series to form a series circuit, each of said gas diodes requiring a higher potential to cause conduction in said diode than to maintain conduction in said diode, a source of electric potential having an amplitude sufficient to maintain conduction in said series circuits and to cause conduction in any one of said gas diodes, means electrically connecting each of said series circuits to said source of electric potential in parallel with each of the other of said series circuits, a source of pulses to be counted, means for simultaneously applying pulses from said source to all of said series circuits, means for preconditioning one of said series circuits for causing conduction therein after a pulse is received by said series circuits, said preconditioning means comprising a plurality of capacitors each electrically connected to the junction between the first and second diodes of a different one of said series circuits and to the junction between the second diode of another of said series circuits and said potential source.

3. A counter circuit for counting pulses applied thereto comprising, a plurality of stages each having a first and a second gas diode electrically connected in series to form a series circuit, each of said gas diodes requiring a higher potential to cause conduction in said diode than to maintain conduction in said diode, a source of electric potential, said potential having an amplitude sufficient to maintain conduction in said series circuits and to cause conduction in any one of said gas diodes, means electrically connecting each of said series circuits to said source of electric potential in parallel with each of the other of said series circuits, and means for temporarily applying said potential to the first diode in a selected one of said series circuits to cause said first diode to conduct, said last named means including a capacitor connected between the junction of the first and second diodes of the selected series circuit and a different one of said series circuits.

4. A counter circuit for counting pulses applied thereto comprising, a plurality of stages each having a first and a second gas diode electrically connected in series to form a series circuit, each of said gas diodes requiring a higher potential to cause conduction in said diode than to maintain conduction in said diode, a source of electric potential having an amplitude sufficient to maintain conduction in said series circuits and to cause conduction in any one of said gas diodes, means electrically connecting each of said series circuits to said source of electric potential in parallel with each of the other of said series circuits, a plurality of capacitors each electrically connected to the junction between the first and second diodes of a different one of said series circuits and to the junction between the second diode of another of said series circuits and said potential source, a voltage divider connected across said source of potential to provide a potential having an amplitude less than the amplitude of the potential of said source, and a plurality of resistors each electrically connected to a different one of said series circuits at the junction between the diodes thereof and to said voltage divider.

5. A counter circuit for counting pulses applied thereto comprising, a plurality of stages each having a first and a second gas diode electrically connected in series to form a series circuit, each of said gas diodes requiring a higher potential to cause conduction in said diode than to maintain conduction in said diode, a source of electric potential, said potential having an amplitude sufficient to maintain conduction in said series circuits and to cause conduction in any one of said gas diodes, means electrically connecting each of said series circuits to said source of electric potential in parallel with each of the other of said series circuits, and means for temporarily applying said potential exclusively to the first diode in a selected one of said series circuits, said last named means including a capacitor connected between the junction of the first and second diodes of the selected series circuit and a different one of said series circuits.

6. A counter circuit for counting pulses applied thereto comprising, a plurality of stages each having a first and a second gas diode electrically connected in series to form a series circuit, each of said gas diodes requiring a higher potential to cause conduction in said diode than to maintain conduction in said diode, a source of electric potential, said potential having an amplitude sufficient to maintain conduction in said series circuits and to cause conduction in any one of said gas diodes, means electrically connecting each of said series circuits to said source of electric potential in parallel with each of the other of said series circuits, a source of pulses to be counted, means for simultaneously applying pulses from said source to all of said series circuits, means for preconditioning one of said series circuits for causing conduction therein after a pulse is received by said series circuits, said preconditioning means including a plurality of capacitors each electrically connected to the junction between the first and second diodes of a different one of said series circuits and to the junction between the second diode of another of said series circuits and said potential source, a voltage divider connected across said source of potential to provide a potential having an amplitude less than the amplitude of the potential of said source, and a plurality of resistors each electrically connected to a different one of said series circuits at the junction between the diodes thereof and to said voltage divider.

7. A counter circuit comprising, a plurality of stages each having a first and a second gas diode electrically connected in series to form a series circuit, a source of electric potential, means electrically connecting each of said series circuits to said source of electric potential in parallel with each of the other of said series circuits, and means for preconditioning one of said series circuits for causing conduction therein, said preconditioning means comprising a capacitor connected between the junction of the first and second diodes of the series circuit to be preconditioned and a different one of said series circuits.

References Cited in the file of this patent

UNITED STATES PATENTS 2,646,534 Manley _______________ July 21, 1953